(12) United States Patent
Zhou et al.

(10) Patent No.: US 11,221,348 B2
(45) Date of Patent: Jan. 11, 2022

(54) IMPEDANCE CONTROLLED TEST SOCKET

(71) Applicant: SMITHS INTERCONNECT AMERICAS, INC., Kansas City, KS (US)

(72) Inventors: Jiachun Zhou, Gilbert, AZ (US); Dexian Liu, Jiangsu (CN); Kevin Deford, Kansas City, KS (US); Jim Spooner, Manteca, CA (US); Bo Shi, Jiangsu (CN)

(73) Assignee: SMITHS INTERCONNECT AMERICAS, INC., Kansas City, KS (US)

( * ) Notice: Subject to any disclaimer, the term of this patent is extended or adjusted under 35 U.S.C. 154(b) by 68 days.

(21) Appl. No.: 16/615,508

(22) PCT Filed: May 29, 2018

(86) PCT No.: PCT/US2018/034927
§ 371 (c)(1),
(2) Date: Nov. 21, 2019

(87) PCT Pub. No.: WO2018/218248
PCT Pub. Date: Nov. 29, 2018

(65) Prior Publication Data
US 2020/0088763 A1    Mar. 19, 2020

Related U.S. Application Data

(60) Provisional application No. 62/511,839, filed on May 26, 2017.

(51) Int. Cl.
*G01R 1/04* (2006.01)
(52) U.S. Cl.
CPC .......... *G01R 1/045* (2013.01); *G01R 1/0466* (2013.01)

(58) Field of Classification Search
CPC .............................. G01R 1/045; G01R 1/0466
See application file for complete search history.

(56) References Cited

U.S. PATENT DOCUMENTS 7,420,383 B2 *   9/2008   Yoshida ................. G01R 1/045
                                                        324/756.07
2004/0212381 A1   10/2004   Yoshida et al.
(Continued)

FOREIGN PATENT DOCUMENTS

KR    10-2008-0024084    3/2008

OTHER PUBLICATIONS

International Search Report and Written Opinion of the International Searching Authority (dated Sep. 5, 2018) for Corresponding International PCT Patent Application No. PCT/US18/034927, filed May 29, 2018.

*Primary Examiner* — Paresh Patel
(74) *Attorney, Agent, or Firm* — Snell & Wilmer LLP

(57) ABSTRACT

Methods, systems, and apparatus for electrical connector assemblies. The assemblies include a socket defining a signal cavity, the socket having a first socket opening and a second socket opening. The assemblies include a signal contact probe located within the signal cavity. The signal contact probe includes a first plunger received in the shell cavity and extending through a first shell opening and located in the first socket opening. The signal contact probe includes a second plunger received in the shell cavity and extending through a second shell opening and located in the second socket opening. The assemblies include an end insulation ring located in the second socket opening and around the second plunger, the end insulation ring configured to facilitate substantially constant impedance through the signal spring probe, and configured to restrict lateral movement of the second plunger within the second socket opening.

19 Claims, 8 Drawing Sheets

(56) References Cited

U.S. PATENT DOCUMENTS

| | | | |
|---|---|---|---|
| 2004/0212383 A1* | 10/2004 | Yanagisawa | G01R 1/0441 324/754.08 |
| 2006/0094134 A1* | 5/2006 | Yoshida | G01R 1/045 438/14 |
| 2009/0145165 A1 | 7/2009 | Satoshi | |
| 2010/0041251 A1* | 2/2010 | Nakayama | G01R 1/045 439/65 |
| 2012/0315775 A1* | 12/2012 | Zhou | G01R 31/2863 439/68 |
| 2013/0203298 A1 | 8/2013 | Zhou et al. | |

* cited by examiner

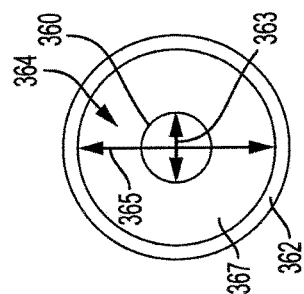
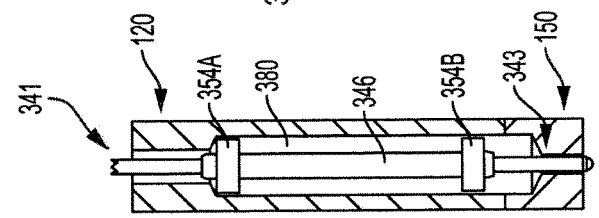
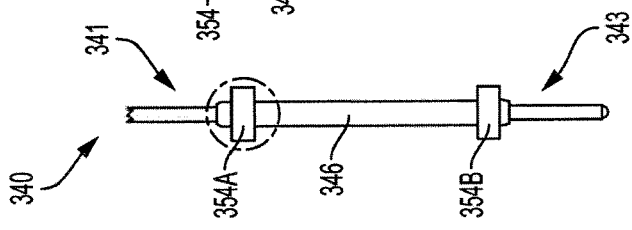
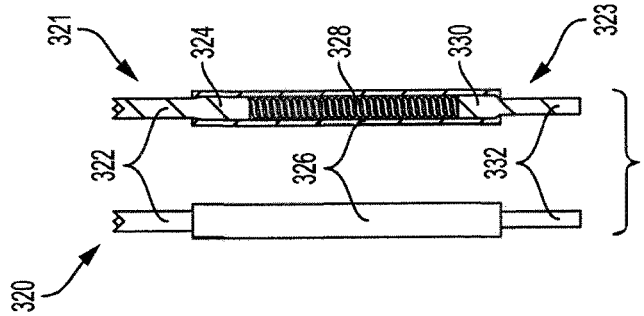
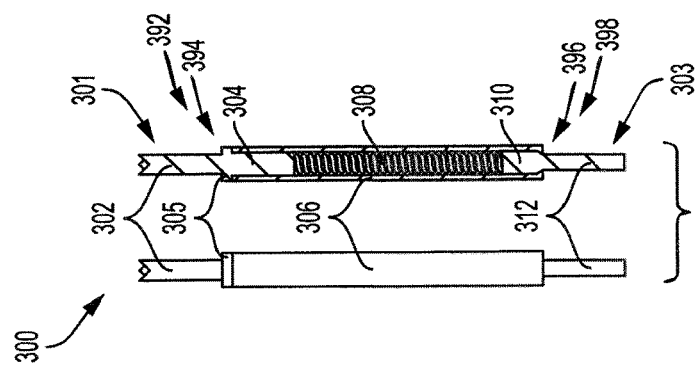

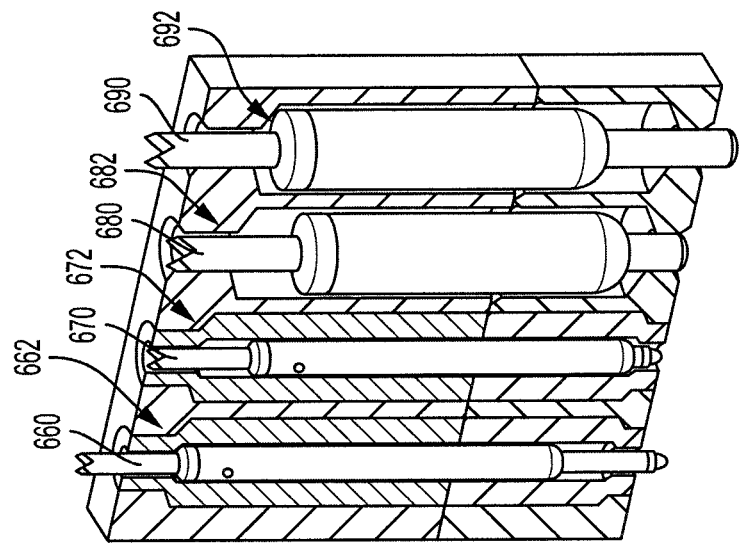
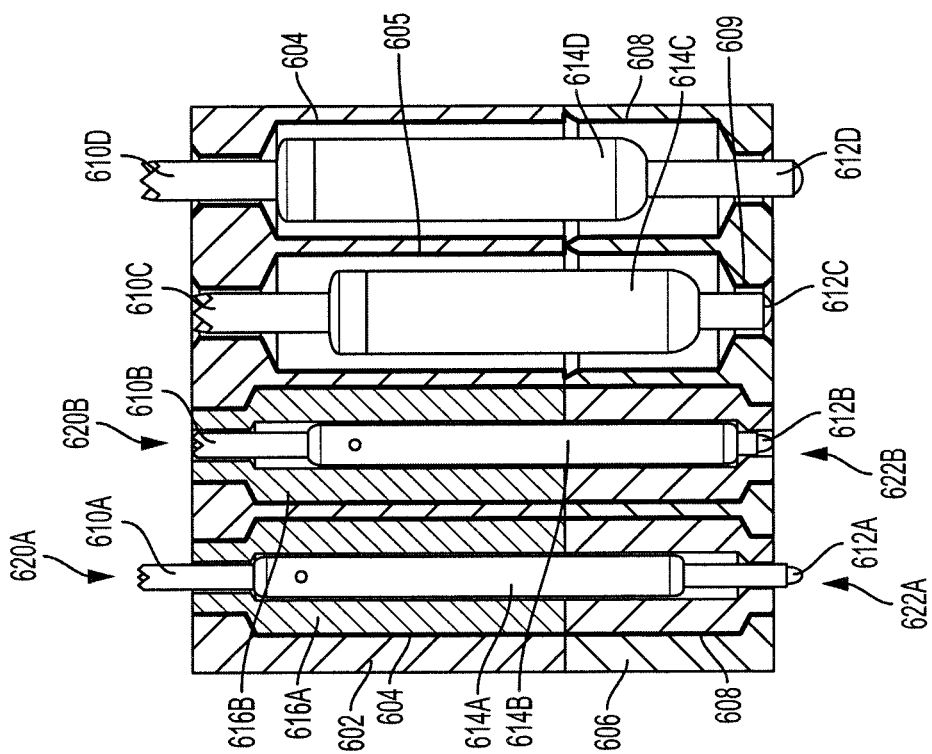

IMPEDANCE CONTROLLED TEST SOCKET

CROSS REFERENCE TO RELATED APPLICATIONS

This application claims the benefit and priority of U.S. Provisional Application Ser. No. 62/511,839, filed May 26, 2017, entitled "Impedance Controlled Test Socket," the contents of which are herein incorporated by reference in its entirety.

BACKGROUND

1. Field

This specification relates to an impedance controlled test socket.

2. Description of the Related Art

In the electronics and semiconductor industries, systems (or sockets) used to test integrated circuit semiconductor chips may be referred to as test systems (or test sockets). A test system may include a socket body and socket retainer defining a plurality of cavities. Each cavity may receive a contactor, which may be a spring probe. Conventionally there are two approaches used maintaining signal integrity in test systems—to use relatively short contactors or to use a coaxial structure for the test systems. Short contactors may have the shortcomings of having small compliance, which may limit its applications in large size integrated circuit packages. Using a coaxial structure for the test systems may be applied when performing high-frequency integrated circuit package testing.

SUMMARY

An electrical contactor assembly (or test system) is described herein. The electrical contactor assembly includes a socket defining a signal cavity, the socket having a first socket opening at a first socket end and a second socket opening at a second socket end opposite the first socket end. The electrical contactor assembly also includes a signal contact probe located within the signal cavity. The signal contact probe includes a shell having a body defining a shell cavity, the shell having a first shell opening at a first end of the shell and a second shell opening at a second end of the shell opposite the first end of the shell. The signal contact probe also includes a first plunger received in the shell cavity and extending through the first shell opening and located in the first socket opening. The signal contact probe also includes a second plunger received in the shell cavity and extending through the second shell opening and located in the second socket opening. The electrical contactor assembly includes an end insulation ring located in the second socket opening and around the second plunger, the end insulation ring configured to facilitate a substantially constant impedance through the signal contact probe, and configured to restrict lateral movement of the second plunger within the second socket opening.

An electrical contactor assembly is described herein. The electrical contactor assembly includes a socket defining a signal cavity, the socket having a first socket opening at a first socket end and a second socket opening at a second socket end opposite the first socket end, the signal cavity having an inner surface. The electrical contactor assembly also includes a signal contact probe located within the signal cavity. The signal contact probe includes a shell having a body defining a shell cavity, the shell having a first shell opening at a first end of the shell and a second shell opening at a second end of the shell opposite the first end of the shell. The signal contact probe also includes a first plunger received in the shell cavity and extending through the first shell opening and located in the first socket opening. The signal contact probe also includes a second plunger received in the shell cavity and extending through the second shell opening and located in the second socket opening. The electrical contactor assembly includes an insulating sleeve made of a dielectric material and occupying substantially an entire space within the signal cavity between the signal contact probe and the inner surface of the signal cavity such that the signal contact probe and the insulating sleeve substantially occupy the signal cavity, the insulating sleeve contacting the first plunger, the second plunger, and the shell, and configured to facilitate a substantially constant impedance through the signal contact probe.

An electrical contactor assembly is described herein. The electrical contactor assembly includes a socket defining a signal cavity, the socket having a first socket opening at a first socket end and a second socket opening at a second socket end opposite the first socket end, the signal cavity having an inner surface. The electrical contactor assembly also includes a first signal contact probe and a second signal contact probe located within the signal cavity, the first signal contact probe and the second signal contact probe forming a differential pair for communicating signals. The electrical contactor assembly also includes an insulating sleeve made of a dielectric material and occupying substantially an entire space within the signal cavity between the first contact probe and the inner surface of the signal cavity, between the second contact probe and the inner surface of the signal cavity, and between the first contact probe and the second contact probe, such that the first contact probe, the second contact probe, and the insulating sleeve substantially occupy the signal cavity, the insulating sleeve configured to maintain signal integrity throughout the first signal contact probe and the second signal contact probe.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale, and may be exaggerated to better illustrate the important features of the present invention.

FIG. 3A is a side view and a cross-sectional view of a spring probe having a top plunger which moves with the shell of the spring probe, according to some embodiments of the invention.

FIG. 3B is a side view and a cross-sectional view of a spring probe having a top plunger which moves independently of the shell of the spring probe, according to some embodiments of the invention.

FIG. 3C is a side view of a spring probe having two insulation rings located on the shell of the spring probe, according to some embodiments of the invention.

FIG. 3D is a detailed view of a portion of the spring probe of FIG. 3C, according to some embodiments of the invention.

FIG. 3E is a cross-sectional view of the spring probe of FIG. 3C in a socket cavity, according to some embodiments of the invention.

FIG. 3F is a top view of socket and a spring probe within the socket, according to some embodiments of the invention.

FIG. 6A is a cross-sectional view of a ground spring probe, a differential pair of signal spring probes, and a power spring probe in a socket, according to some embodiments of the invention.

FIG. 6B is a perspective view of the system of FIG. 6A, according to some embodiments of the invention.

DETAILED DESCRIPTION

Conventional test sockets are made of plastic and may not be able to transfer high-frequency signals (e.g., signals greater than 35 GHz). The test systems described herein have features which make them capable of transferring high-frequency signals by matching impedance at both ends of the contact probe.

Figure 1:
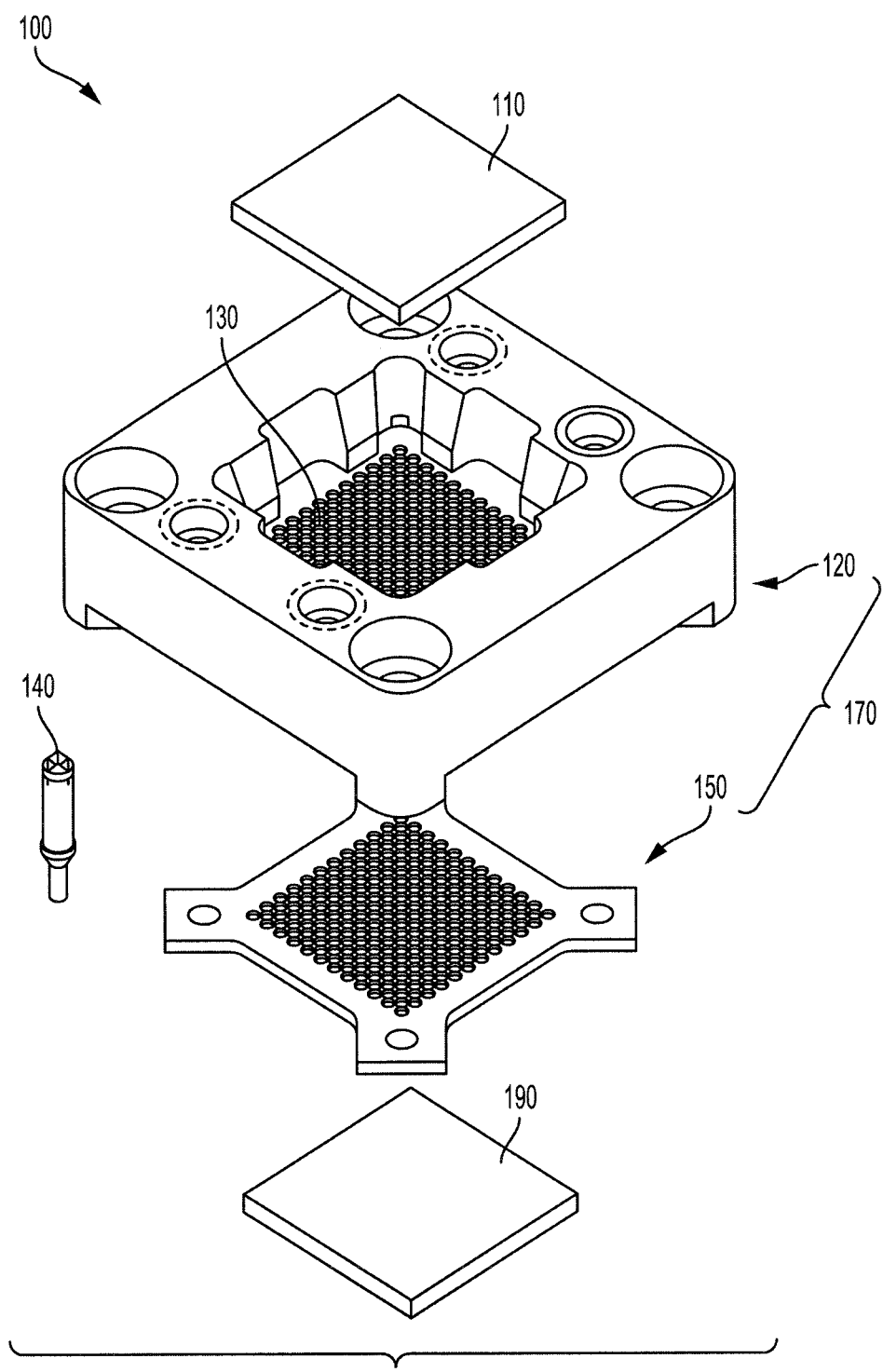
FIG. 1 is an exploded view of a test system, according to some embodiments of the invention.

FIG. 1 illustrates a test system 100, which can provide an electrical connection between an electronic device 110 (which can be an IC chip, and can also be referred to as a "Device Under Test," or "DUT") and a printed circuit board (PCB) 190. The test system 100 can include a plurality of aligned connectors 140 (which can be spring probes) for providing an electrical connection between the electronic device 110 and the PCB 190. The test system 100 can further include a socket body 120 and a socket retainer 150, each of which include a plurality of openings or cavities 130 to accommodate the plurality of aligned connectors 140, where the plurality of openings in the socket retainer 150 are configured to align with the plurality of openings in the socket body 120. The socket body 120 and the socket retainer 150 may collectively be referred to as a socket 170.

Figure 2A:
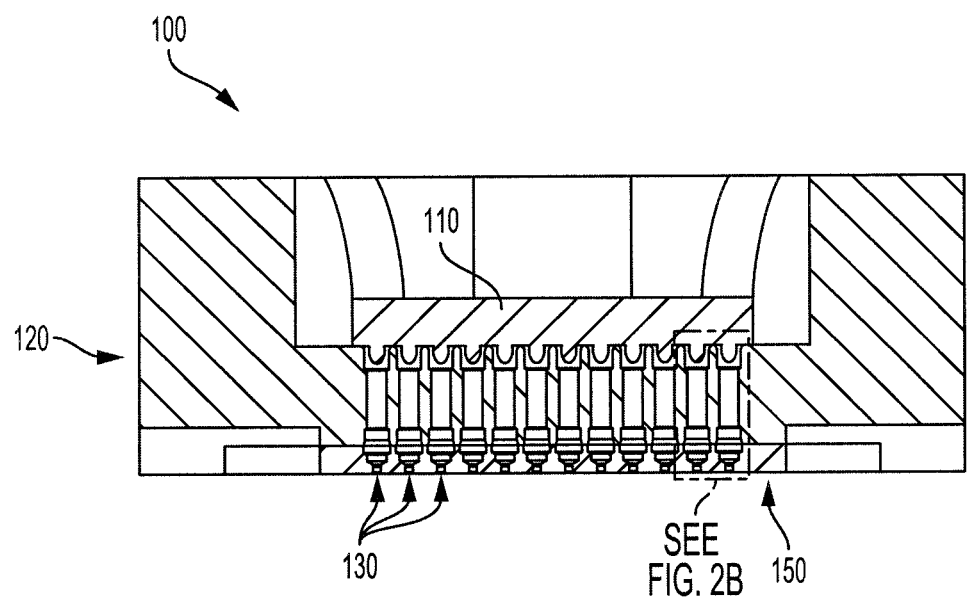
FIG. 2A is a cross-sectional view of the test system of FIG. 1, according to some embodiments of the invention.

FIG. 2A is a cross sectional view of the test system 100. FIG. 2A illustrates the plurality of cavities 130 being aligned with at least a portion of the electronic device 110. The plurality of cavities 130 are within the socket body 120 and the socket retainer 150.

Figure 2B:
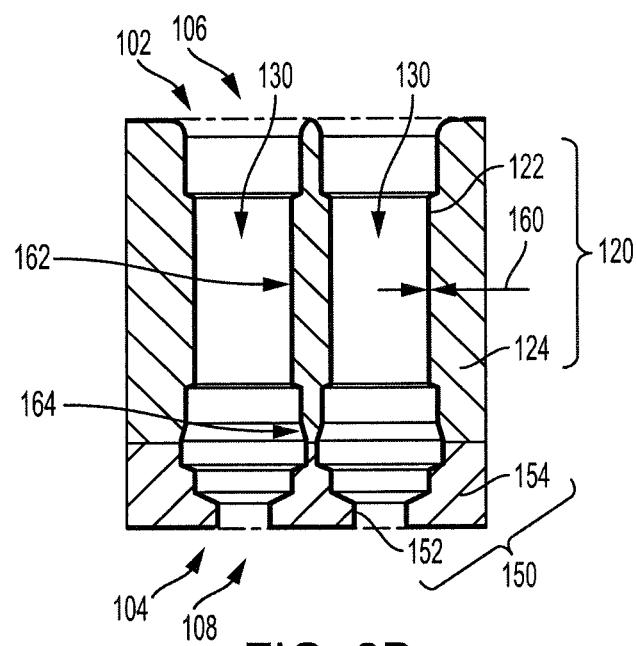
FIG. 2B is a detailed view of a portion of the test system of FIG. 2A, according to some embodiments of the invention.

FIG. 2B illustrates an enlargement of a portion of FIG. 2A. As depicted in FIG. 2B, for example, the socket body 120 can comprise a metal structure 124 and a body insulation layer 122. In addition, the socket retainer 150 can comprise a metal retainer 154 and a retainer insulation layer 152. The connectors 140 of FIG. 1 are conductive to transport electrical current and are kept from contacting each other in order to avoid an electrical short. The body insulation layer 122 and the retainer insulation layer 152 can prevent the connectors 140 from contacting the metal structure 124 and the metal retainer 154. The socket body 120 and the socket retainer 150 (collectively socket 170) may have a first opening 102 at a first end 106 and a second opening 104 at a second end 108 of the socket 170. The first end 106 and the second end 108 may be located on opposite sides of the socket 170.

The body insulation layer 122 and the retainer insulation layer 152, as depicted in FIG. 2B, for example, are provided respectively, on an annular inner surface 162 of the metal structure 124 and on an annular inner surface 164 of the metal retainer 154. Accordingly, the body insulation layer 122 and the retainer insulation layer 152 can prevent the connectors 140 from contacting the metal structure 124 and the metal retainer 154.

In some embodiments, the metal structure 124 and the metal retainer 154 may be made of a metal, such as, but not limited to, aluminum, magnesium, titanium, zirconium, copper, iron and/or an alloy of the same. In addition, the body insulation layer 122 and the retainer insulation layer 152 may include an insulated layer, such as an anodic film generated on the metal (or any such layer on the metal surface generated by an anodizing process) plus a polytetrafluoroethylene (PTFE) coating. In some embodiments, the metal structure 124 and the metal retainer 154 may comprise an aluminum alloy. In other embodiments, the body insulation layer 122 and the retainer insulation layer 152 may comprise anodized aluminum. In addition, in some embodiments, the body insulation layer 122 and the retainer insulation layer 152 may include a sealing layer of PTFE. The anodized aluminum layer in both or either of the body insulation layer 122 and the retainer insulation layer 152 may have a thickness greater than about 0.02 mm. The PTFE layer in both or either of the body insulation layer 122 and the retainer insulation layer 152 may have a thickness greater than about 0.001 mm.

As described above, other suitable materials for the metal structure 124 and the metal retainer 154 can include magnesium, titanium, zirconium, copper, iron and/or an alloy of the same. For such other materials, a thickness 160 of both or either of the r and the retainer insulation layer 152 can be chosen based upon the electrical resistivity and the required electrical breakdown voltage of the body insulation layer 122 and the retainer insulation layer 152. Such technical requirements may influence the selection of a suitable material and thickness 160 for the body insulation layer 122 and the retainer insulation layer 152.

The socket body 120 may have a much higher strength than conventional plastic composite material used in conventional test systems. For example, the socket bodies of conventional test systems made of plastic can deform under a force associated with the connectors 140 in the cavities 130. This deformation can affect the electrical performance of the conventional test systems and may cause them to not be able to transmit high-frequency signals. Moreover, the magnitude of the deformation can be related to socket material strength. In contrast, the socket body 120 comprising metal structure 124 and body insulation layer 122, may have a higher strength than conventional plastic used in conventional socket bodies. In addition, when the socket body 120 and the socket retainer 150 are made of metal, the test system 100 is capable of handling high-frequency signals.

According to a further embodiment, a method of fabricating the socket body 120 includes fabricating the metal structure 124 to accommodate the plurality of connectors 140. Consistent with an embodiment, the fabricated metal structure 124 can be coated (and/or a layer can be generated on the surface) using surface coating technology and/or chemical processes. In addition, in some embodiments, the body insulation layer 122 can comprise a sealing layer of PTFE or another suitable coating that provides electrical insulation.

A method of fabricating the socket retainer 150 includes fabricating the metal retainer 154 to accommodate the plurality of connectors 140 and to align with the plurality of openings in the metal structure 124. The fabricated metal retainer 154 can be coated (and/or a layer can be generated on the surface) using surface coating technology and/or chemical processes. In addition, in some embodiments, the retainer insulation layer 152 can comprise a sealing layer of PTFE or another suitable coating that provides electrical insulation.

FIGS. 3A-3F depict various spring probes. As shown in FIG. 3A, the spring probe 300 includes a shell 306, a first plunger 301, and a second plunger 303. The first plunger 301 is located at a first opening 392 on the first end 394 of the shell 306. The second plunger 303 is located at a second opening 396 on the second end 398 of the shell 306. The first end 394 and the second end 398 are located on opposite ends of the shell 306.

The shell 306 can be tube-shaped, and at least a portion of the first plunger 301 and the second plunger 303 may be disposed within the shell 306. The socket body 120 and the socket retainer 150 of the test system 100 of FIGS. 1 and 2A-2B can position the spring probes 300 such that the first plungers 301 electrically connect to conductive pads on the IC chip 110, and the second plungers 303 electrically connect to conductive pads on the PCB.

The first plunger 301 can include a tip portion 302 that extends away from the shell 306. The first plunger 301 can also include a flange 305 that abuts the end of the shell 306 so that when a force is applied to the first plunger 301 toward the shell 306, the flange 305 pushes against the end of the shell 306 so that the first plunger 301 and the shell 306 move together. The second plunger 303 can include a tip portion 312 that extends outwardly from the shell 306.

The first plunger 301 can also include a tail portion 304 inserted into the shell 306 and attached to the shell 306 (e.g., using adhesive) so that the first plunger 301 and the shell 306 move together. The flange 305 can be disposed between the tip portion 302 and the tail portion 304. The second plunger 303 can also include a tail portion 310 inserted into the shell 306. The end of the shell 306 that receives the second plunger 303 can be crimped to retain the tail portion 310 of the second plunger 303 in the shell 306 so that the tail portion 310 is slidable within the shell 306. The tip portion 312 can extend outwardly from the shell 306 away from the tail portion 310.

A spring 308 can be disposed between the two plungers 301 and 303. The spring 308 can be capable of exerting a force against each plunger 301 and 303 to bias the second plunger 303 outwardly from the shell 306 and away from the first plunger 301. The second plunger 303 can also be depressed inwardly into the shell 306 under a force directed inward against the spring 308. Thus, the first plunger 301 can be connected to the shell 306 to move with the shell 306, and the second plunger 303 can be slidable with respect to the shell 306.

FIG. 3B depicts a spring probe 320 in which both plungers are slidable with respect to the shell 326. The spring probe 320 can include a shell 326, a first plunger 321, and the second plunger 323. The shell 326 can be tube-shaped, and at least a portion of the first and second plungers 321 and 323 are disposed within the shell 326. The spring probe 320 can be positioned in the socket body 120 and the socket retainer 150 of the test system 100 of FIGS. 1 and 2A-2B such that the first plungers 321 electrically connect to conductive pads on the IC chip 110, and the second plungers 323 electrically connect to conductive pads on the PCB 190.

The first plunger 321 can include a tip portion 322 that extends away from the shell 326. The first plunger 321 can also include a tail portion 324 inserted into the shell 326. The end of the shell 326 that receives the first plunger 321 can be crimped to retain the tail portion 324 of the first plunger 321 in the shell 326 so that the tail portion 324 is slidable within the shell 326. The tip portion 322 can extend outwardly from the shell 326 away from the tail portion 324.

The second plunger 323 can also include a tail portion 330 inserted into the shell 326. The end of the shell 326 that receives the second plunger 323 can be crimped to retain the tail portion 330 of the second plunger 323 in the shell 326 so that the tail portion 330 is slidable within the shell 326. The tip portion 332 can extend outwardly from the shell 326 away from the tail portion 330.

The spring 328 can be disposed between the two plungers 321 and 323. The spring 328 can be capable of exerting a force against each plunger 321 and 323 outwardly from the shell 326. Also, each of the plungers 321 and 323 can be depressed inwardly into the shell 326 under a respective force directed inward against the spring 328. Thus, the first and second plungers 321 and 323 can be slidable with respect to the shell 326.

The spring probe 300 or 320 can be formed from conductive materials, such as copper alloy coated with gold, so that an electrical connection is formed between the first plunger 301 or 321, the second plunger 303 or 323, and the shell 306 or 326.

FIG. 3C illustrates a spring probe 340 with insulation members 354. The spring probe 340 includes a shell 346, a first plunger 341 located at a first end of the shell 346, and a second plunger 343 located at a second end of the shell 346. The shell 346 can be tube-shaped (e.g., cylindrical or having a cross-section with a shape, such as a circular, oval, square, rectangular, or other shape). At least a portion of the first and second plungers 341 and 343 can be disposed within the shell 346 as described herein.

The first plunger 341, the second plunger 343, and the shell 346 can be formed of conductive materials (e.g., copper alloy coated with gold) so that an electrical connection is formed between the first plunger 341, the second plunger 343, and the shell 346.

An insulation member (or insulation ring) 354 can be connected to the first plunger 341 and/or the shell 346. In FIGS. 3C-3E, there are two insulation members 354A and 354B. The first insulation member 354A is located proximal to the first plunger 341 and the second insulation member is located proximal to the second plunger 343. The first insulation member 354A and the second insulation member 354B are depicted as surrounding the shell 346. However, in some embodiments, the first insulation member 354 may surround both the first plunger 341 and the shell 346 or just the first plunger 341. Likewise, in some embodiments, the second plunger 343 may surround both the second plunger 343 and the shell 346 or just the second plunger 343.

The insulation member 354 may be a ring formed of an insulating material, such as polytetrafluoroethylene (PTFE) or other nonconductive material, such as plastic, polymer, rubber, etc. The insulation member 354 can have an outer surface having a peripheral dimension (e.g., an outer diameter) that is greater than a peripheral dimension (e.g., outer diameter) of an outer surface of the shell 346. The outer surface of the insulation member 354 can have a similar shape (but larger) as an outer surface of the shell 346 (e.g., having a cross-section with a shape, such as a circular, oval, square, rectangular, or other shape).

FIG. 3D shows a detailed cross-section of the insulation member 354 in an embodiment. The insulation member 354 can include a through-hole or opening 356 configured to allow the insulation member 354 to be disposed on the shell 346.

The insulation member 354 can be held in position due to a compression fit of the insulation member 354 on the outer surface of the shell 346. The insulation member 354 can be formed of a resilient material, and can be connected to the outer surface of the shell 346 due to a radially compressive force exhibited by the insulation member 354 when pulled onto the shell 346. For example, the opening 356 of the insulation member 354 can have a smaller inner dimension (e.g., inner diameter) than an outer dimension (e.g., outer diameter) of the shell 346. The free end of the shell 346 can be inserted through the opening 356 in the insulation member 354, thereby causing the insulation member 354 to expand or stretch to fit around the shell 346. The elasticity of the insulation member 354 can provide a compressive radial pressure or force on the shell 346 such that the insulation member 354 can be held in place on the shell 346. Alternatively, or in addition to the method(s) described herein, the insulation member 354 can be held in position using adhesive or other attachment methods.

While the insulation member 354 is shown as being disposed on the outer surface of the shell 346, in other embodiments, the shell 346 may have a narrowed section on the outer surface of the shell 346 for positioning and receiving the insulation member 354. The narrowed section can be a cut or groove formed in at least a portion of the periphery of a section of the shell 346.

FIG. 3E shows the spring probe 340 positioned in a socket (or socket shell) assembly including a top portion, such as a socket body 120, and a bottom portion, such as a socket retainer 150, to form an electrical contactor assembly. The space 380 within the socket assembly not occupied by the spring probe 340 may be occupied by a dielectric material.

In the depicted embodiment, two insulation members 354A and 354B are provided. One of the insulation members 354A can be provided closer to the first end of the shell 346 and the other insulation member 354B can be provided closer to the second end of the shell 346. Alternatively, more than two insulation members 354 can be provided. The insulation members 354 can be generally similar in size, shape, and materials as the insulation member 354.

The spring probe 340 may be similar to spring probe 300, which has a first plunger 301 that moves with the shell 306.

Alternatively, spring probe 340 may be similar to spring probe 320, which has a first plunger 321 that moves independently of the shell 326.

FIG. 3F illustrates a top view of a socket having a spring probe 360 similar to spring probes 300, 320, and 340. Spring probe 360 has a diameter 363 and is located within a socket assembly 362, which has an inner diameter 365. The space 364 between the spring probe 360 and the socket assembly 362 may be filled with a dielectric material 367. The diameter 363 of the spring probe 360 may be measured at the shell portion of the spring probe or the plunger portion of the spring probe.

Similar to the impedance of a coaxial cable, the impedance of the socket may be determined by the formula $$Z_0 = \frac{138}{\sqrt{\varepsilon_r}} \log_{10} \frac{D}{d}$$

where $Z_0$ is impedance, D is the inner diameter 365 of the socket assembly 362, d is the diameter 363 of the spring probe 360, and $\varepsilon_r$ is the relative dielectric constant of the insulator 367. A relatively constant impedance from the top of the spring probe to the bottom of the spring probe allows for the system to handle higher frequency signals. In addition, by adjusting the diameter 363 of the spring probe 360 and the inner diameter 365 of the socket assembly 362, a particular desired impedance may be achieved.

Figure 4C:
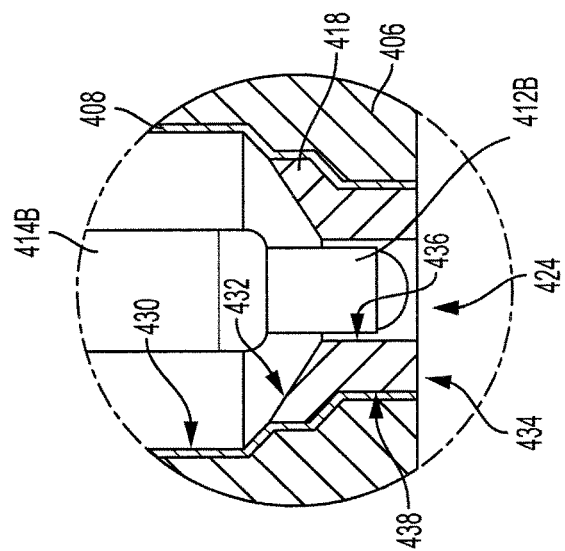
FIG. 4C is a detailed view of the end insulation member of FIG. 4A, according to some embodiments of the invention.
Figure 4B:
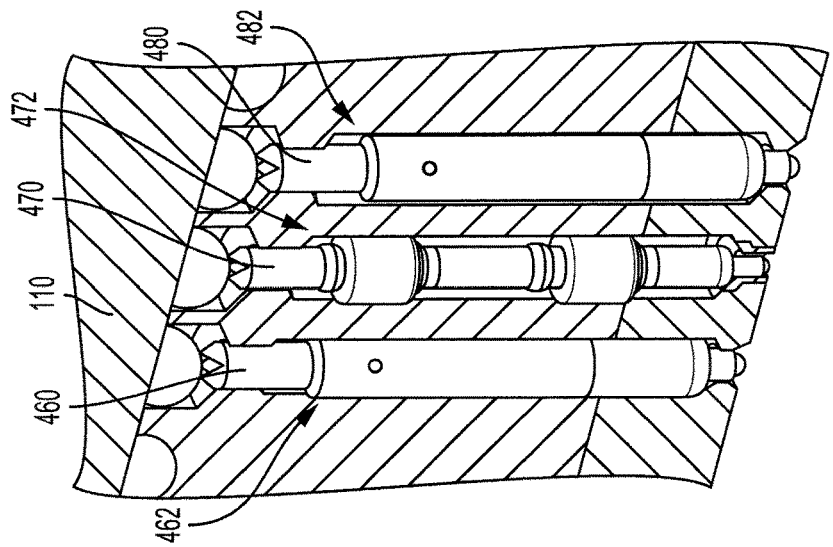
FIG. 4B is a perspective view of the system of FIG. 4A, according to some embodiments of the invention.
Figure 4A:
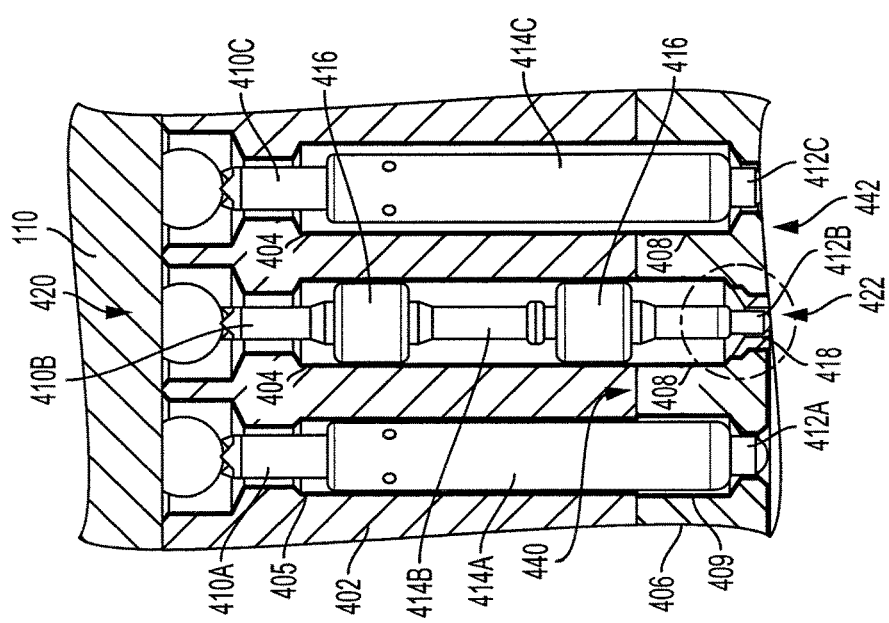
FIG. 4A is a cross-sectional view of a ground spring probe, a signal spring probe having two insulation members and an end insulation ring, and a power spring probe in a socket, according to some embodiments of the invention.

FIGS. 4A-4C illustrate a portion of a test system capable of handling high-frequency signals, according to embodiments of the invention. The test system includes socket body 402 and socket retainer 406 having three socket cavities (or shells)—a ground cavity 462 for a ground contact probe 460, a signal cavity 472 for a signal contact probe 470, and a power cavity 482 for a power contact probe 480.

The socket body 402 and the socket retainer 406 may be made out of a metal, as described herein. Each socket cavity has a socket cavity inner surface. The socket cavity inner surface of the signal cavity 472 and the power cavity 482 may be covered by an insulation layer. In particular, the socket body 402 of the signal cavity 472 and the power cavity 482 may have a socket body insulation layer 404 and the socket retainer 406 of the signal cavity 472 and the power cavity 482 may have a socket retainer insulation layer 408. The socket body insulation layer 404 and the socket retainer insulation layer 408 may be treated, coated, or plated, with a dielectric material to insulate the contact probe housed therein.

The socket cavity inner surface of the ground cavity 462 may either not be covered by any material, or may be covered by a conductive layer. In particular, the socket body 402 of the ground cavity 462 may have a socket body conductive layer 405 and the socket retainer 406 of the ground cavity 462 may have a socket retainer conductive layer 409.

The ground contact probe 460 may be similar to spring probe 300 or 320 of FIGS. 3A and 3B. The ground contact probe 460 includes a first plunger 410A and a second plunger 412A, partially housed within shell 414A.

In conventional systems, a conductive material may not be applied to the inner surface of the ground cavity 462, as the ground contact probe 460 may make contact with the socket body 402 and socket retainer 406 and perform its functions. However, when the conductive material is not applied to the inner surface of the ground cavity 462, oxidation may form between the ground contact probe 460 and the socket body 402 and socket retainer 406. When oxidation occurs, the impedance of the assembly is increased. Therefore, to discourage oxidation and to improve the performance of the assembly, a conductive material (e.g., gold, copper, nickel, or any other conductive material which is not easily oxidized) is applied to the inner surface of the ground cavity 462.

The signal contact probe 470 may be similar to any of the spring probes 300, 320 or 340 of FIGS. 3A-3E. The signal contact probe 470 includes a first plunger 410B and a second plunger 412B, partially housed within shell 414B. The signal contact probe 470 also has two shell insulation members 416 disposed on the shell 414B. While two shell insulation members (one proximal to the first plunger 410B and one proximal to the second plunger 412B) are shown, there may be more than two shell insulation members on the shell 414B and located anywhere on the shell 414B.

The shell insulation members 416 may be rings that wrap around a portion of a circumference of the outside surface of the shell 414B of the signal contact probe 470 or may wrap around the entirety of a circumference of the outside surface of the shell 414B of the signal contact probe 470. Accordingly, the shell insulation members 416 may be annular in shape. The shell insulation members 416 may be of varying widths and heights.

Within the signal cavity 472, there is an end insulation ring 418. The end insulation ring 418 is disposed around the second plunger 412B of the signal contact probe 470 through an opening 424 of the end insulation ring 418. The end insulation ring 418 is made of materials similar to that of the shell insulation members 416 (e.g., an insulating material, such as polytetrafluoroethylene (PTFE) or other nonconductive material, such as plastic, polymer, rubber, etc.).

The end insulation ring 418 may be connected to the inner surface of the signal cavity 472. More specifically, as illustrated in FIG. 4C, the end insulation ring 418 may be disposed on top of the socket retainer insulation layer 408. The end insulation ring 418 may have a flange portion 432 and a tapered portion 434. The flange portion 432 is located further inward in the signal cavity 472 compared to the tapered portion 434. The tapered portion 434 may be located proximal to the opening where the second plunger 412B connects to the PCB. The end insulation ring 418 has an outside surface 438 which contacts an interior surface 430 of the socket retainer insulation layer 408. The end insulation ring 418 has an interior surface 436 which contacts portions of the second plunger 412B.

An adhesive may be disposed between the outside surface 438 of the end insulation ring 418 and the interior surface 430 of the socket retainer insulation layer 408. The adhesive may hold the end insulation ring 418 in place within the signal cavity 472. The adhesive may be applied to the outside surface 438 of the end insulation ring 418 and/or the interior surface 430 of the socket retainer insulation layer 408 before the end insulation ring 418 is inserted into the signal cavity 472. During a time when the socket body 402 and the socket retainer 406 are not connected, the end insulation ring 418 may be inserted into the first end 440 of the socket retainer 406 and moved toward the second end 442 of the socket retainer 406.

Alternatively, or in addition, the end insulation ring 418 can be held in position due to a compression fit of the end insulation ring 418 on the interior surface 430 of the socket retainer insulation layer 408. The end insulation ring 418 can be formed of a resilient material, and can be connected to the interior surface 430 of the socket retainer insulation layer 408 due to a radially expansive force exhibited by the end insulation ring 418 when compressed into the signal cavity 472. For example, the opening of the signal cavity 472 can have a smaller inner dimension (e.g., inner diameter) than an outer dimension (e.g., outer diameter) of the end insulation ring 418.

During a time when the socket body 402 and the socket retainer 406 are not connected, the end insulation ring 418 may be inserted into the first end 440 of the socket retainer 406 and moved toward the second end 442 of the socket retainer 406.

In some embodiments, the end insulation ring 418 is connected to the second plunger 412B, via an adhesive and/or by compression fit, as described herein similar to the connection of the end insulation ring 418 to the socket cavity 472.

The end insulation ring 418 is configured to assist in maintaining a relatively constant impedance throughout the signal contact probe 470. As described herein, the impedance at any given point of the signal contact probe 470 is based on the inner diameter of the socket assembly, the diameter of the spring probe, and the relative dielectric constant of the insulator surrounding the spring probe. The diameter of the first plunger 410B may be different from the diameter of the second plunger 412B, and the geometry of the socket body 402 at the first plunger 410B may be different from the geometry of the socket retainer 406 at the second plunger 412B. Accordingly, the impedances at the first plunger 410B and the second plunger 412B may be different, if the end insulation ring 418 is not present. The end insulation ring 418 may have a thickness and may be made of certain materials so that the impedance at the second plunger 412B matches the impedance at the first plunger 410B. This improves the integrity of the signal transmitted via the signal contact probe 470. When the impedances are mismatched at the two ends (first point 420 and second point 422) of a contact probe, a bottleneck may form, and the assembly may not perform as efficiently as possible. The end insulation ring 418, the shell insulation members, and the socket body insulation layer 404 and the socket retainer insulation layer 408 are configured to maintain a constant (or substantially constant) impedance of the signal. Improved signal integrity leads to improved high-frequency signal transfer capabilities.

For example, conventional signal contact probes are capable of transmitting a maximum frequency of 35 GHz, but the signal contact probes described herein may be capable of transmitting at a maximum frequency of greater than 35 GHz (e.g., at least 45 GHz to 55 GHz or larger).

The end insulation ring 418 is also configured to hold the second plunger 412B in place. That is, lateral (or horizontal) movement of the second plunger 412B is restricted by the presence of the end insulation ring 418 within the signal cavity opening.

The power contact probe 480 may be similar to spring probe 300 or 320 of FIGS. 3A and 3B. The power contact probe 480 includes a first plunger 410C and a second plunger 412C, partially housed within shell 414C.

In some embodiments, the length of the signal contact probe 470, the ground contact probe 460, and/or the power contact probe 480 is greater than or equal to 0.70 mm. In some embodiments, the distance between any two of the signal contact probe 470, the ground contact probe 460, and/or the power contact probe 480 is greater than or equal to 0.70 mm.

While the ground contact probe 460 is illustrated as being to the left of the signal contact probe 470 the power contact probe 480 is shown as being to the right of the signal contact probe 470, in some embodiments, the power contact probe 480 may be located to the left of the signal contact probe 470 and the ground contact probe 460 may be located to the right of the signal contact probe 470.

Figure 5C:
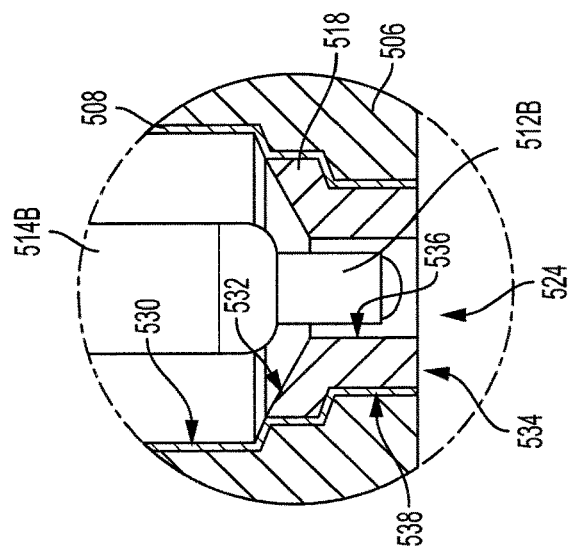
FIG. 5C is a detailed view of the end insulation member of FIG. 5A, according to some embodiments of the invention.
Figure 5B:
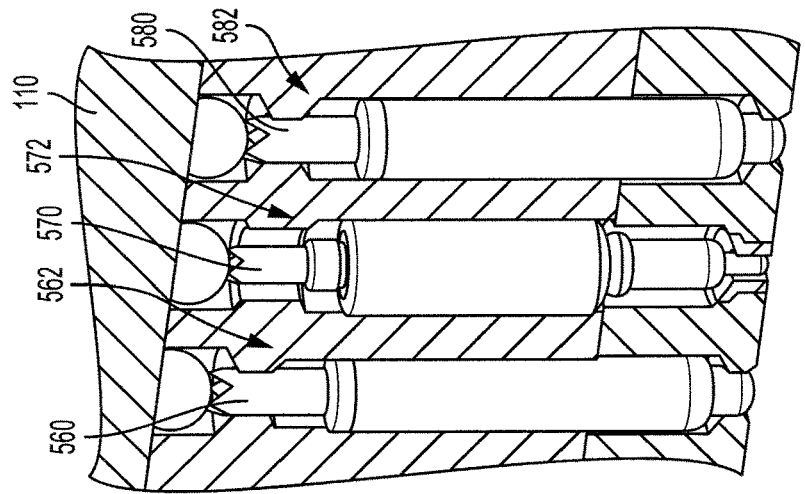
FIG. 5B is a perspective view of the system of FIG. 5A, according to some embodiments of the invention.
Figure 5A:
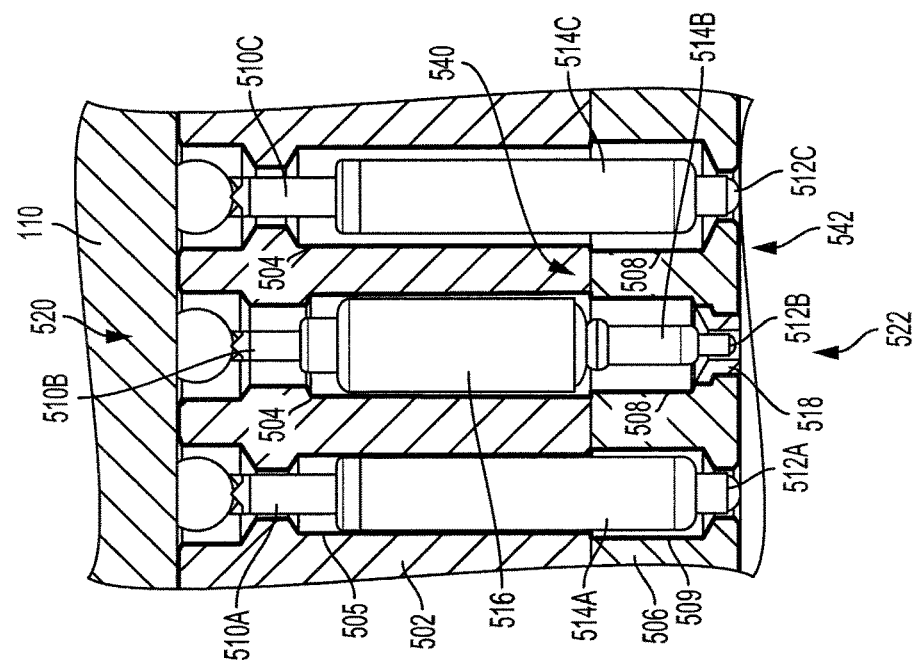
FIG. 5A is a cross-sectional view of a ground spring probe, a signal spring probe having a single insulation member, and a power spring probe in a socket, according to some embodiments of the invention.

FIGS. 5A-5C illustrate a portion of a test system capable of handling high-frequency signals, according to embodiments of the invention. The test system includes socket body 502 and socket retainer 506 having three socket cavities (or shells)—a ground cavity 562 for a ground contact probe 560, a signal cavity 572 for a signal contact probe 570, and a power cavity 582 for a power contact probe 580.

The socket cavity inner surface of the signal cavity 572 and the power cavity 582 may be covered by an insulation layer. In particular, the socket body 502 of the signal cavity 572 and the power cavity 582 may have a socket body insulation layer 504 and the socket retainer 506 of the signal cavity 572 and the power cavity 582 may have a socket retainer insulation layer 508. The socket body insulation layer 504 and the socket retainer insulation layer 508 may be treated, coated, or plated, with a dielectric material to insulate the contact probe housed therein.

The socket cavity inner surface of the ground cavity 562 may either not be covered by any material, or may be covered by a conductive layer. In particular, the socket body 502 of the ground cavity 562 may have a socket body conductive layer 505 and the socket retainer 506 of the ground cavity 562 may have a socket retainer conductive layer 509.

The ground contact probe 560 may be similar to spring probe 300 or 320 of FIGS. 3A and 3B. The ground contact probe 560 includes a first plunger 510A and a second plunger 512A, partially housed within shell 514A.

In conventional systems, a conductive material may not be applied to the inner surface of the ground cavity 562, as the ground contact probe 560 may make contact with the socket body 502 and socket retainer 506 and perform its functions. However, when the conductive material is not applied to the inner surface of the ground cavity 562, oxidation may form between the ground contact probe 560 and the socket body 502 and socket retainer 506. When oxidation occurs, the impedance of the assembly is increased. Therefore, to discourage oxidation and to improve the performance of the assembly, a conductive material (e.g., gold, copper, nickel, or any other conductive material which is not easily oxidized) is applied to the inner surface of the ground cavity 562.

The signal contact probe 570 may be similar to any of the spring probes 300, 320 or 340 of FIGS. 3A-3E. The signal contact probe 570 includes a first plunger 510B and a second plunger 512B, partially housed within shell 514B. The signal contact probe 570 also has a single shell insulation member 516 disposed on the shell 514B occupying substantially all of the surface area of the shell 514B within the socket body 502. In some embodiments, the shell insulation member 516 extends into the socket retainer 506 and substantially all of the surface area of the shell 514B is covered by the shell insulation member 516.

The shell insulation member 516 may be a ring that wraps around a portion of a circumference of the outside surface of the shell 514B of the signal contact probe 570 or may wrap around the entirety of a circumference of the outside surface of the shell 514B of the signal contact probe 570. Accordingly, the shell insulation member 516 may be annular in shape.

Within the signal cavity 572, there is an end insulation ring 518 similar to the end insulation ring 418 of FIGS. 4A-4C. The end insulation ring 518 is disposed around the second plunger 512B of the signal contact probe 570 through an opening 524 of the end insulation ring 518. The end insulation ring 518 is made of materials similar to that of the shell insulation members 516 (e.g., an insulating material, such as polytetrafluoroethylene (PTFE) or other nonconductive material, such as plastic, polymer, rubber, etc.).

The end insulation ring 518 may be connected to the inner surface of the signal cavity 572. More specifically, as shown in FIG. 5C, the end insulation ring 518 may be disposed on top of the socket retainer insulation layer 508. The end insulation ring 518 may have a flange portion 532 and a tapered portion 534. The flange portion 532 is located further inward in the signal cavity 572 compared to the tapered portion 534. The tapered portion 534 may be located proximal to the opening where the second plunger 512B connects to the PCB. The end insulation ring 518 has an outside surface 538 which contacts an interior surface 530 of the socket retainer insulation layer 508. The end insulation ring 518 has an interior surface 536 which contacts portions of the second plunger 512B.

An adhesive may be disposed between the outside surface 538 of the end insulation ring 518 and the interior surface 530 of the socket retainer insulation layer 508. The adhesive may hold the end insulation ring 518 in place within the signal cavity 572. The adhesive may be applied to the outside surface 538 of the end insulation ring 518 and/or the interior surface 530 of the socket retainer insulation layer 508 before the end insulation ring 518 is inserted into the signal cavity 572. During a time when the socket body 502 and the socket retainer 506 are not connected, the end insulation ring 518 may be inserted into the first end 540 of the socket retainer 506 and moved toward the second end 542 of the socket retainer 506.

Alternatively, or in addition, the end insulation ring 518 can be held in position due to a compression fit of the end insulation ring 518 on the interior surface 530 of the socket retainer insulation layer 508. The end insulation ring 518 can be formed of a resilient material, and can be connected to the interior surface 530 of the socket retainer insulation layer 508 due to a radially expansive force exhibited by the end insulation ring 518 when compressed into the signal cavity 572. For example, the opening of the signal cavity 572 can have a smaller inner dimension (e.g., inner diameter) than an outer dimension (e.g., outer diameter) of the end insulation ring 518.

During a time when the socket body 502 and the socket retainer 506 are not connected, the end insulation ring 518 may be inserted into the first end 540 of the socket retainer 506 and moved toward the second end 542 of the socket retainer 506.

In some embodiments, the end insulation ring 518 is connected to the second plunger 512B, via an adhesive and/or by compression fit, as described herein similar to the connection of the end insulation ring 518 to the signal cavity 572.

The end insulation ring 518 is configured to assist in maintaining a relatively constant impedance throughout the signal contact probe 570. As described herein, the impedance at any given point of the signal contact probe 570 is based on the inner diameter of the socket assembly, the diameter of the spring probe, and the relative dielectric constant of the insulator surrounding the spring probe. The diameter of the first plunger 510B may be different from the diameter of the second plunger 512B, and the geometry of the socket body 502 at the first plunger 510B may be different from the geometry of the socket retainer 506 at the second plunger 512B. Accordingly, the impedances at the first plunger 510B and the second plunger 512B may be different, if the end insulation ring 518 is not present. The end insulation ring 518 may have a thickness and may be made of certain materials so that the impedance at the second plunger 512B matches the impedance at the first plunger 510B. This improves the integrity of the signal transmitted via the signal contact probe 570. When the impedances are mismatched at the two ends (first point 520 and second point 522) of a contact probe, a bottleneck may form, and the assembly may not perform as efficiently as possible. The end insulation ring 518, the shell insulation members, and the socket body insulation layer 504 and the socket retainer insulation layer 508 are configured to maintain a constant (or substantially constant) impedance of the signal. Improved signal integrity leads to improved high-frequency signal transfer capabilities.

For example, conventional signal contact probes are capable of transmitting a maximum frequency of 35 GHz, but the signal contact probes described herein may be capable of transmitting at a maximum frequency of greater than 35 GHz (e.g., at least 45 GHz to 55 GHz or larger).

The end insulation ring 518 is also configured to hold the second plunger 512B in place. That is, lateral (or horizontal) movement of the second plunger 512B is restricted by the presence of the end insulation ring 518 within the signal cavity opening.

The power contact probe 580 may be similar to spring probe 300 or 320 of FIGS. 3A and 3B. The power contact probe 580 includes a first plunger 510C and a second plunger 512C, partially housed within shell 514C.

While the ground contact probe 560 is illustrated as being to the left of the signal contact probe 570 the power contact probe 580 is shown as being to the right of the signal contact probe 570, in some embodiments, the power contact probe 580 may be located to the left of the signal contact probe 570 and the ground contact probe 560 may be located to the right of the signal contact probe 570.

FIGS. 6A-6B illustrate a portion of a test system capable of handling high-frequency signals, according to embodiments of the invention. The test system includes socket body 602 and socket retainer 606 having four socket cavities (or shells)—a first signal cavity 662 for a first signal contact probe 660, a second signal cavity 672 for a second signal contact probe 670, a ground cavity 682 for a ground contact probe 680, and a power cavity 692 for a power contact probe 690.

The socket body 602 and the socket retainer 606 may be made out of a metal, as described herein. Each socket cavity has a socket cavity inner surface. The socket cavity inner surface of the first signal cavity 662, the second signal cavity 672, and the power cavity 692 may be covered by an insulation layer. In particular, the socket body 402 of the first signal cavity 662, the second signal cavity 672, and the power cavity 692 may have a socket body insulation layer 604 and the socket retainer 606 of the first signal cavity 662, the second signal cavity 672, and the power cavity 692 may have a socket retainer insulation layer 608. The socket body insulation layer 604 and the socket retainer insulation layer 608 may be treated, coated, or plated, with a dielectric material to insulate the contact probe housed therein.

The socket cavity inner surface of the ground cavity 682 may either not be covered by any material, or may be covered by a conductive layer. In particular, the socket body 602 of the ground cavity 682 may have a socket body conductive layer 605 and the socket retainer 606 of the ground cavity 682 may have a socket retainer conductive layer 609.

In conventional systems, a conductive material may not be applied to the inner surface of the ground cavity 682, as the ground contact probe 680 may make contact with the socket body 602 and socket retainer 606 and perform its functions. However, when the conductive material is not applied to the inner surface of the ground cavity 682, oxidation may form between the ground contact probe 680 and the socket body 602 and socket retainer 606. When oxidation occurs, the impedance of the assembly is increased. Therefore, to discourage oxidation and to improve the performance of the assembly, a conductive material (e.g., gold, copper, nickel, or any other conductive material which is not easily oxidized) is applied to the inner surface of the ground cavity 682.

The first signal contact probe 660 and the second signal contact probe 670 may each be similar to any of the spring probes 300 or 320 of FIGS. 3A-3E. The first signal contact probe 660 and the second signal contact probe 670 may be a differential pair of signal probes. The first signal contact probe 660 and the second signal contact probe 670 may each communicate signals in only one direction. For example, the first signal contact probe 660 may communicate signals only from the IC chip 110 to the PCB 190 and the second signal contact probe 670 may communicate signals only from the PCB 190 to the IC chip 110. In another example, the first signal contact probe 660 may communicate signals only from the PCB 190 to the IC chip 110 and the second signal contact probe 670 may communicate signals only from the IC chip 110 to the PCB 190. Any electromagnetic interference generated by one of the signal contact probes may be cancelled out or reduced by electromagnetic interference generated by the other signal contact probe.

The first signal contact probe 660 includes a first plunger 610A and a second plunger 612A, partially housed within shell 614A. A first insulating sleeve 616A may surround the first signal contact probe 660 and may occupy the area of the first signal cavity 662 not occupied by the first signal contact probe 660. Accordingly, substantially all of the surface area of the shell 614A may be covered by the first insulating sleeve 616A. The first insulating sleeve 616A may wrap around all of the circumference of the outside surface of the shell 614A or may wrap around only a portion of the circumference of the outside surface of the shell 614A of the first signal contact probe 660. The first insulating sleeve 616A may be annular in shape and may be made of an insulating material, such as polytetrafluoroethylene (PTFE) or other nonconductive material, such as plastic, polymer, rubber, etc.

The first insulating sleeve 616A facilitates maintaining a consistent impedance through the first signal contact probe 660. The first insulating sleeve 616A is configured to assist in matching a first impedance at a first point 620A at the first plunger 610A with a second impedance at a second point 622A at the second plunger 612A, to improve the integrity of the signal transmitted via the first signal contact probe 660. When the impedances are mismatched at the two ends of a contact probe, a bottleneck may form, and the assembly may not perform as efficiently as possible. Improved signal integrity leads to improved high-frequency signal transfer capabilities.

The first insulating sleeve 616A may have two parts—a first part occupying the area of the first signal cavity not occupied by the first signal contact probe 660 within the socket body 602, and a second part occupying the area of the first signal cavity not occupied by the first signal contact probe 660 within the socket retainer 606.

In some embodiments, the first signal contact probe 660 is inserted into the two halves of the first insulating sleeve 616A (a first half configured to be located in the socket body 602 and a second half configured to be located in the socket retainer 606). The first signal contact probe 660 covered by the first insulating sleeve 616A is then placed within the first signal cavity 662. In other embodiments, the two halves of the first insulating sleeve 616A are first disposed within the socket body 602 and the socket retainer 606, and then the first signal contact probe 660 is placed within the two halves of the first insulating sleeve 616A.

In some embodiments, an adhesive connects the first insulating sleeve 616A to the first signal cavity 662. In some embodiments, the first insulating sleeve 616A is compression fit into the first signal cavity 662.

In some embodiments, an adhesive connects the first insulating sleeve 616A to the first signal contact probe 660. In some embodiments, the first insulating sleeve 616A is compression fit onto the first signal contact probe 660.

The second signal contact probe 670 includes a first plunger 610B and a second plunger 612B, partially housed within shell 614B. A second insulating sleeve 616B may surround the second signal contact probe 670 and may occupy the area of the second signal cavity 672 not occupied by the second signal contact probe 670. Accordingly, substantially all of the surface area of the shell 614B may be covered by the second insulating sleeve 616B. The second insulating sleeve 616B may wrap around all of the circumference of the outside surface of the shell 614B or may wrap around only a portion of the circumference of the outside surface of the shell 614B of the second signal contact probe 670. The second insulating sleeve 616B may be annular in shape and may be made of an insulating material, such as polytetrafluoroethylene (PTFE) or other nonconductive material, such as plastic, polymer, rubber, etc.

The second insulating sleeve 616B facilitates maintaining a consistent impedance through the second signal contact probe 670. The second insulating sleeve 616B is configured to assist in matching a first impedance at a first point 620B at the first plunger 610B with a second impedance at a second point 622B at the second plunger 612B, to improve the integrity of the signal transmitted via the first signal contact probe 670. Ideally, the first impedance and the second impedance are the same. When the impedances are mismatched at the two ends of a contact probe, a bottleneck may form, and the assembly may not perform as efficiently as possible. Improved signal integrity leads to improved high-frequency signal transfer capabilities.

The second insulating sleeve 616B may have two parts—a first part occupying the area of the second signal cavity not occupied by the second signal contact probe 670 within the socket body 602, and a second part occupying the area of the second signal cavity not occupied by the second signal contact probe 670 within the socket retainer 606.

In some embodiments, the second signal contact probe 670 is inserted into the two halves of the second insulating sleeve 616B (a first half configured to be located in the socket body 602 and a second half configured to be located in the socket retainer 606). The second signal contact probe 670 covered by the second insulating sleeve 616B is then placed within the second signal cavity 672. In other embodiments, the two halves of the second insulating sleeve 616B are first disposed within the socket body 602 and the socket retainer 606, and then the second signal contact probe 670 is placed within the two halves of the second insulating sleeve 616B.

In some embodiments, an adhesive connects the second insulating sleeve 616B to the second signal cavity 672. In some embodiments, the second insulating sleeve 616B is compression fit into the second signal cavity 672.

In some embodiments, an adhesive connects the second insulating sleeve 616B to the second signal contact probe 670. In some embodiments, the second insulating sleeve 616B is compression fit onto the second signal contact probe 670.

The ground contact probe 680 may be similar to spring probe 300 or 320 of FIGS. 3A and 3B. The ground contact probe 680 includes a first plunger 610C and a second plunger 612C, partially housed within shell 614C.

The power contact probe 690 may be similar to spring probe 300 or 320 of FIGS. 3A and 3B. The power contact probe 690 includes a first plunger 610D and a second plunger 612D, partially housed within shell 614D.

While the ground contact probe 680 is illustrated as being between the second signal contact probe 670 and the power contact probe 690, in some embodiments, the power contact probe 690 may be located between the second signal contact probe 670 and the ground contact probe 680.

In some embodiments, the length of the first signal contact probe 660, the second signal contact probe 670, the ground contact probe 680, and/or the power contact probe 690 is greater than or equal to 0.65 mm. In some embodiments, the distance between any two of the first signal contact probe 660, the second signal contact probe 670, the ground contact probe 680, and/or the power contact probe 690 is greater than or equal to 0.65 mm.

Figure 7A:
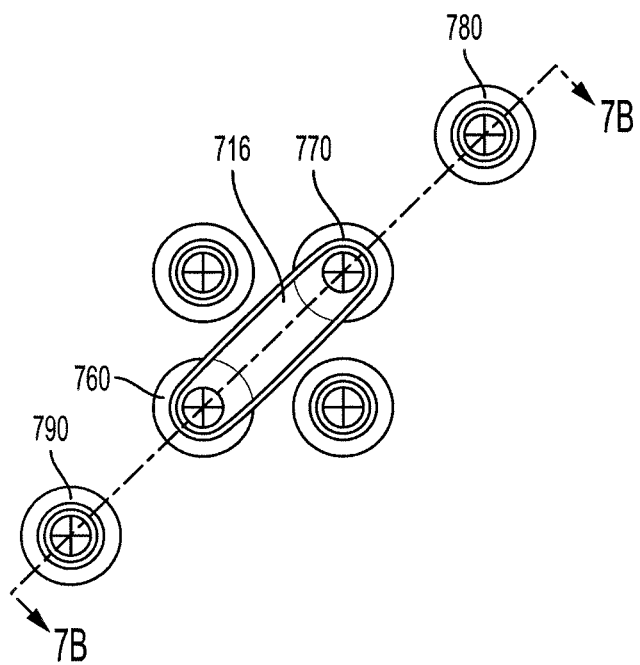
FIG. 7A is a top view of a ground spring probe, a differential pair of signal spring probes, and a power spring probe in a socket, according to some embodiments of the invention.
Figure 7B:
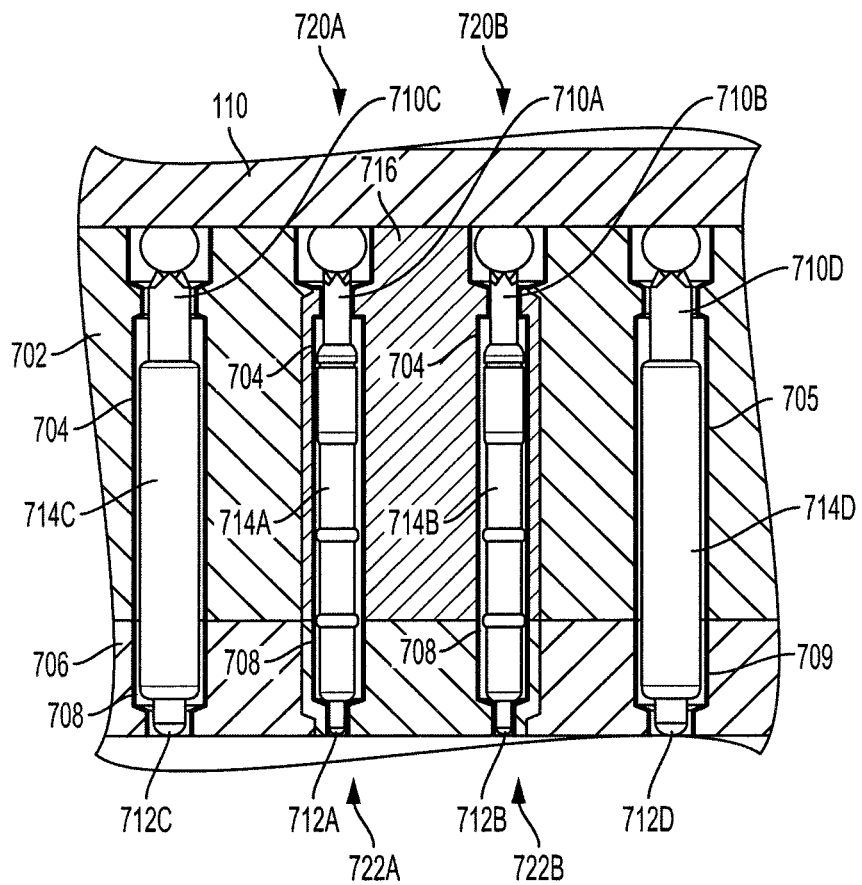
FIG. 7B is a cross-sectional view of a ground spring probe, a differential pair of signal spring probes, and a power spring probe in a socket, according to some embodiments of the invention.
Figure 7C:
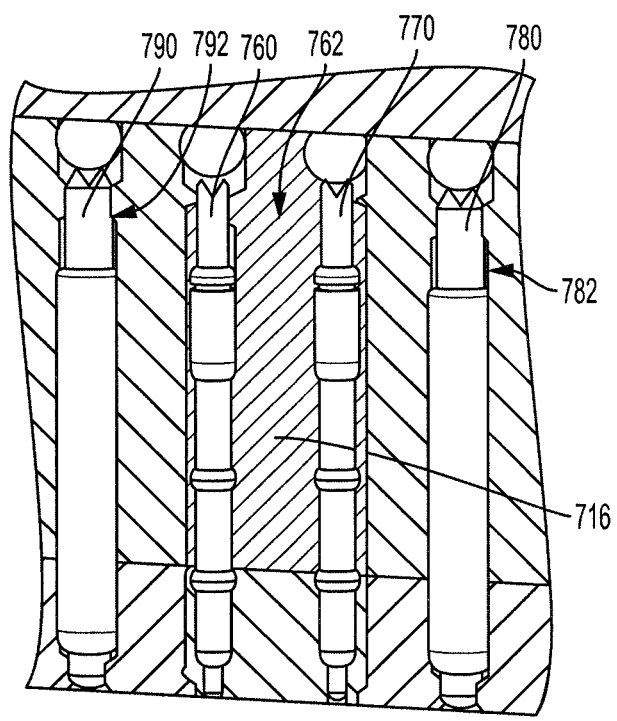
FIG. 7C is a perspective view of the system of FIG. 7B, according to some embodiments of the invention.

FIGS. 7A-7C illustrate a portion of a test system capable of handling high-frequency signals, according to embodiments of the invention. The test system includes socket body 702 and socket retainer 706 having four socket cavities (or shells)—a signal cavity 762 for a first signal contact probe 760 and a second signal contact probe 770, a ground cavity 782 for a ground contact probe 780, and a power cavity 792 for a power contact probe 790. As the signal cavity 762 houses both the first signal contact probe 760 and the second signal contact probe 770, the signal cavity 762 may be substantially larger than the ground cavity 782 or the power cavity 792.

The socket body 702 and the socket retainer 706 may be made out of a metal, as described herein. Each socket cavity has a socket cavity inner surface. The socket cavity inner surface of the signal cavity 762 and the power cavity 792 may be covered by an insulation layer. In particular, the socket body 702 of the signal cavity 762 and the power cavity 792 may have a socket body insulation layer 704 and the socket retainer 706 of the signal cavity 762 and the power cavity 792 may have a socket retainer insulation layer 708. The socket body insulation layer 704 and the socket retainer insulation layer 708 may be treated, coated, or plated, with a dielectric material to insulate the contact probe housed therein.

The socket cavity inner surface of the ground cavity 782 may either not be covered by any material, or may be covered by a conductive layer. In particular, the socket body 702 of the ground cavity 782 may have a socket body conductive layer 705 and the socket retainer 706 of the ground cavity 782 may have a socket retainer conductive layer 709.

In conventional systems, a conductive material may not be applied to the inner surface of the ground cavity 782, as the ground contact probe 780 may make contact with the socket body 702 and socket retainer 706 and perform its functions. However, when the conductive material is not applied to the inner surface of the ground cavity 782, oxidation may form between the ground contact probe 780 and the socket body 702 and socket retainer 706. When oxidation occurs, the impedance of the assembly is increased. Therefore, to discourage oxidation and to improve the performance of the assembly, a conductive material (e.g., gold, copper, nickel, or any other conductive material which is not easily oxidized) is applied to the inner surface of the ground cavity 782.

The first signal contact probe 760 and the second signal contact probe 770 may each be similar to any of the spring probes 300 or 320 of FIGS. 3A-3E. The first signal contact probe 760 and the second signal contact probe 770 may be a differential pair of signal probes. The first signal contact probe 760 and the second signal contact probe 770 may each communicate signals in only one direction. For example, the first signal contact probe 760 may communicate signals only from the IC chip 110 to the PCB 190 and the second signal contact probe 770 may communicate signals only from the PCB 190 to the IC chip 110. In another example, the first signal contact probe 760 may communicate signals only from the PCB 190 to the IC chip 110 and the second signal contact probe 770 may communicate signals only from the IC chip 110 to the PCB 190. Any electromagnetic interference generated by one of the signal contact probes may be cancelled out or reduced by electromagnetic interference generated by the other signal contact probe.

The combined signal cavity 762 is larger than the cavities 792 and 782 for the ground contact probe 790 and the power contact probe 780. By having the two signal contact probes 760 and 770 in the same socket cavity and separated by only the dielectric material of the insulating sleeve 716, any electromagnetic field (or "noise") generated from the first signal contact probe may be cancelled out by the corresponding electromagnetic field generated from the second signal contact probe. When the metal forming the socket body and socket retainer is located between the two signal contact probes of a differential pair, the electromagnetic fields generated by each contact probe may not cancel out, resulting in reduced signal integrity.

The first signal contact probe 760 includes a first plunger 710A and a second plunger 712A, partially housed within shell 714A. The second signal contact probe 770 includes a first plunger 710B and a second plunger 712B, partially housed within shell 714B.

An insulating sleeve 716 may surround the first signal contact probe 760 and the second signal contact probe 770. The insulating sleeve 716 may occupy the area of the signal cavity 762 not occupied by the first signal contact probe 760 and the second signal contact probe 770. Accordingly, substantially all of the surface area of the shell 714A and the shell 714B may be covered by the insulating sleeve 716.

The insulating sleeve 716 may wrap around all of the circumference of the outside surface of the shell 714A or may wrap around only a portion of the circumference of the outside surface of the shell 714A of the first signal contact probe 760. The insulating sleeve 716 may wrap around all of the circumference of the outside surface of the shell 714B or may wrap around only a portion of the circumference of the outside surface of the shell 714B of the second signal contact probe 770.

The insulating sleeve 716 may be made of an insulating material, such as polytetrafluoroethylene (PTFE) or other nonconductive material, such as plastic, polymer, rubber, etc. The insulating sleeve 716 is configured to assist in matching a first impedance at a first point 720A at the first plunger 710A with a second impedance at a second point 722A at the second plunger 712A and matching a first impedance at a first point 720B at the first plunger 710B with a second impedance at a second point 722B at the second plunger 712B, to improve the integrity of the signal transmitted via the first signal contact probe 760 and the second signal contact probe 770. Ideally, the first impedance and the second impedance are the same. When the impedances are mismatched at the two ends of a contact probe, a bottleneck may form, and the assembly may not perform as efficiently as possible. Improved signal integrity leads to improved high-frequency signal transfer capabilities.

The insulating sleeve 716 may have two parts—a first part occupying the area of the signal cavity not occupied by the first signal contact probe 760 and the second signal contact probe 770 within the socket body 702, and a second part occupying the area of the signal cavity not occupied by the first signal contact probe 760 and the second signal contact probe 770 within the socket retainer 706.

In some embodiments, the first signal contact probe 760 and the second signal contact probe 770 are inserted into the two halves of the insulating sleeve 716 (a first half configured to be located in the socket body 702 and a second half configured to be located in the socket retainer 706). The signal contact probes covered by the insulating sleeve 716 is then placed within the signal cavity 762. In other embodiments, the two halves of the insulating sleeve 716 are first disposed within the socket body 602 and the socket retainer 606, and then the first signal contact probe 760 and the second signal contact probe 770 are placed within the two halves of the insulating sleeve 716.

In some embodiments, an adhesive connects the insulating sleeve 716 to the signal cavity 762. In some embodiments, the insulating sleeve 716 is compression fit into the signal cavity 762.

The ground contact probe 780 may be similar to spring probe 300 or 320 of FIGS. 3A and 3B. The ground contact probe 780 includes a first plunger 710C and a second plunger 712C, partially housed within shell 714C.

The power contact probe 790 may be similar to spring probe 300 or 320 of FIGS. 3A and 3B. The power contact probe 790 includes a first plunger 710D and a second plunger 712D, partially housed within shell 714D.

In some embodiments, the test system illustrated in FIGS. 7A-7C may include an end insulation member described herein. However, since the socket openings may not be circular, an oval-shaped end insulation member may be used.

In some embodiments, the length of the first signal contact probe 760, the second signal contact probe 770, the ground contact probe 780, and/or the power contact probe 790 is greater than or equal to 0.65 mm.

The electrical connector assemblies described herein may be capable of improvements in signal transmission speed as compared to conventional connector assemblies. As used herein, substantially may mean at least 75%. While hatch marks may be used in the cross-sectional illustrations to distinguish one element from another, in some situations, the hatch marks indicate the elements are made of different materials, and in other situations, the elements may be made of the same material despite having different hatch mark patterns.

Exemplary embodiments of the methods/systems have been disclosed in an illustrative style. Accordingly, the terminology employed throughout should be read in a nonlimiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. An electrical contactor assembly comprising:
   a socket defining a signal cavity, the socket having a first socket opening at a first socket end and a second socket opening at a second socket end opposite the first socket end;
   a signal contact probe located within the signal cavity, the signal contact probe comprising:
      a shell having a body defining a shell cavity, the shell having a first shell opening at a first end of the shell and a second shell opening at a second end of the shell opposite the first end of the shell,
      a first plunger received in the shell cavity and extending through the first shell opening and located in the first socket opening,
      a second plunger received in the shell cavity and extending through the second shell opening and located in the second socket opening, and
      a first shell insulation member located on an outside surface of the shell and away from the first plunger and the second plunger, the first shell insulation member configured to prevent the shell from contacting the socket; and
   an end insulation ring located in the second socket opening and around the second plunger, the end insulation ring configured to facilitate a substantially constant impedance through the signal contact probe, and configured to restrict lateral movement of the second plunger within the second socket opening.

2. The electrical contactor assembly of claim 1, further comprising:
   a ground cavity having a conductive material disposed on an inner surface of the ground cavity; and
   a ground contact probe located within the ground cavity and separated from contacting the socket by the conductive material disposed on the inner surface of the ground cavity.

3. The electrical contactor assembly of claim 1, wherein the socket includes a socket body and a socket retainer, the socket body and the socket retainer being made of a metal material.

4. The electrical contactor assembly of claim 3, wherein the socket body further comprises a body insulation layer disposed on an inner surface of the signal cavity located in the socket body, and wherein the socket retainer further comprises a retainer insulation layer disposed on an inner surface of the signal cavity located in the socket retainer.

5. The electrical contactor assembly of claim 1, wherein the first shell insulation member occupies substantially all of the outside surface of the shell within the socket body.

6. The electrical contactor assembly of claim 1, further comprising a second shell insulation member located proximal to the second plunger, and wherein the first shell insulation member is located proximal to the first plunger.

7. The electrical contactor assembly of claim 6, wherein the first shell insulation member and the second shell insulation member are located within the socket body.

8. The electrical contactor assembly of claim 1, wherein the end insulation ring is made of polytetrafluoroethylene.

9. The electrical contactor assembly of claim 1, wherein the end insulation ring is attached to an inner surface of the socket by an epoxy.

10. The electrical contactor assembly of claim 1, wherein the end insulation ring is attached to an inner surface of the socket by compression fit.

11. An electrical contactor assembly comprising:
    a socket defining a signal cavity, the socket having a socket body, a socket retainer a first socket opening at a first socket end, and a second socket opening at a second socket end opposite the first socket end, the signal cavity having an inner surface;
    a signal contact probe located within the signal cavity, the signal contact probe comprising:
       a shell having a body defining a shell cavity, the shell having a first shell opening at a first end of the shell and a second shell opening at a second end of the shell opposite the first end of the shell,
       a first plunger received in the shell cavity and extending through the first shell opening and located in the first socket opening, and
       a second plunger received in the shell cavity and extending through the second shell opening and located in the second socket opening; and
    an insulating sleeve made of a dielectric material and occupying substantially an entire space within the signal cavity between the signal contact probe and the inner surface of the signal cavity such that the signal contact probe and the insulating sleeve substantially occupy the signal cavity, the insulating sleeve having a first part occupying an area of the signal cavity not occupied by the signal contact probe within the socket body and a second part occupying an area of the signal cavity not occupied by the signal contact probe within the socket retainer, the first part and the second part directly contacting each other, the insulating sleeve contacting the first plunger, the second plunger, and the shell, and configured to facilitate a substantially constant impedance through the signal contact probe.

12. The electrical contactor assembly of claim 11, further comprising:
    a ground cavity having a conductive material disposed on an inner surface of the ground cavity, and
    a ground contact probe located within the ground cavity and separated from contacting the socket by the conductive material disposed on the inner surface of the ground cavity.

13. The electrical contactor assembly of claim 11, wherein the socket body and the socket retainer are made of a metal material.

14. The electrical contactor assembly of claim 13, wherein the socket body further comprises a body insulation layer disposed on an inner surface of the signal cavity located in the socket body, and wherein the socket retainer further comprises a retainer insulation layer disposed on an inner surface of the signal cavity located in the socket retainer.

15. The electrical contactor assembly of claim 11, further comprising a second signal contact probe located within a second signal cavity, and a second insulating sleeve occupying substantially an entire space within the second signal cavity between the second signal contact probe and an inner surface of the second signal cavity such that the second signal contact probe and the second insulating sleeve occupy substantially an entire space within the second signal cavity, wherein the signal contact probe is a first signal contact probe, and the first signal contact probe and the second signal contact probe are configured to form a differential pair for communicating signals.

16. An electrical contactor assembly comprising:
   a socket defining a signal cavity, the socket having a socket body, a socket retainer, a first socket opening at a first socket end, and a second socket opening at a second socket end opposite the first socket end, the signal cavity having an inner surface;
   a first signal contact probe and a second signal contact probe located within the signal cavity, the first signal contact probe and the second signal contact probe forming a differential pair for communicating signals; and
   an insulating sleeve made of a dielectric material and occupying substantially an entire space within the signal cavity between the first contact probe and the inner surface of the signal cavity, between the second contact probe and the inner surface of the signal, cavity, and between the first contact probe and the second contact probe, such that the first contact probe, the second contact probe, and the insulating sleeve substantially occupy the signal cavity, the insulating sleeve having a first part occupying an area of the signal cavity not occupied by the first signal contact probe and the second signal contact probe within the socket body and a second part occupying an area of the signal cavity not occupied by the first signal contact probe and the second signal contact probe within the socket retainer, the first part and the second part directly contacting each other, the insulating sleeve configured to maintain signal integrity throughout the first signal contact probe and the second signal contact probe.

17. The electrical contactor assembly of claim 16, further comprising:
   a ground cavity having a conductive material disposed on an inner surface of the ground cavity, and
   a ground contact probe located within the ground cavity and separated from contacting the socket by the conductive material disposed on the inner surface of the ground cavity.

18. The electrical contactor assembly of claim 16, wherein the socket body and the socket retainer are made of a metal material.

19. The electrical contactor assembly of claim 18, wherein the socket body further comprises a body insulation layer disposed on an inner surface of the cavity located in the socket body, and wherein the socket retainer further comprises a retainer insulation layer disposed on an inner surface of the cavity located in the socket retainer.

* * * * *